Nov. 28, 1961 P. E. MARENHOLTZ 3,011,130

TEMPERATURE COMPENSATED AMPLIFIER

Filed July 10. 1958

INVENTOR:
Pete E. Marenholtz

By Smyth & Roston
Attorneys

United States Patent Office 3,011,130 Patented Nov. 28, 1961

3,011,130

TEMPERATURE COMPENSATED AMPLIFIER

Pete E. Marenholtz, San Diego, Calif., assignor to Daystrom, Incorporated, Murray Hill, N.J., a corporation of New Jersey Filed July 10, 1958, Ser. No. 747,641
2 Claims. (Cl. 330—25)

Figure 1:
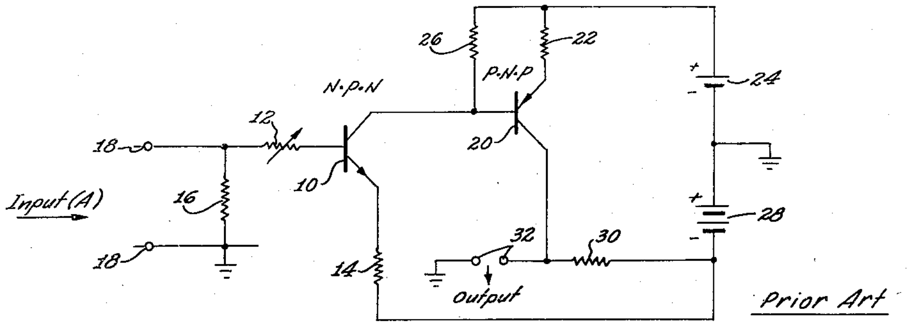

The present invention relates to electronic amplifier circuits, and it relates more particularly to an improved temperature compensated amplifier of the transistor type.

The discovery of the transistor has aided materially in the advance of the electronic art, and these units have been used in many different types of electronic circuits to replace vacuum tubes. Transistors have many advantages over vacuum tubes. For example, a transistor exhibits lower power consumption, requires less space, is more rugged, and has longer life than the equivalent vacuum tube.

However, most transistors have certain inherent instabilities, and these instabilities have had an adverse effect on circuit parameters whenever it has been attempted to substitute them for vacuum tubes in the different types of electronic circuits.

There is one particular transistor instability that has proven to be especially troublesome. This instability is the tendency of the effective internal resistance of the transistor to change with temperature. This has been of particular importance in low-frequency and direct-current transistor amplifiers of the direct-coupled type. There has been a tendency for direct-coupled transistor amplifiers in the prior art to drift as a result of such resistance changes in the transistors.

It has been found, for example, that when a transistor is incorporated in an amplifier with its collector direct-coupled to the base of a second transistor, and when an input current is passed between the emitter and base of the first transistor, there is a tendency for a leakage current to flow between the collector and emitter of that transistor. This leakage current becomes part of the amplified signal which is presented to the second transistor for further amplification. This leakage current varies in accordance with temperature changes of the transistors, and it has been found that the leakage current is a logarithmic function of temperature.

Therefore, the input current to the second transistor will vary with temperature, causing the prior art direct-coupled amplifier output to drift with temperature changes, even though the input current to the first transistor is held constant.

The magnitude of the transistor leakage current can be controlled by varying an external resistance in the input circuit to the base of the first transistor. This leakage current increases as the external resistance is increased, but it still remains a logarithmic function of temperature.

For the above reasons, a direct-coupled amplifier using transistors is subject to drift as a result of temperature changes in the transistors. The present invention, however, provides a temperature-compensated direct-coupled transistor amplifier in which such temperature drift is held, for example, to less than 10 millivolts in a full range of ±10 volts.

The transistor amplifier of the invention can therefore be used as a precision operational amplifier, and it can employ feedback of the voltage or current type, or both. When employed as an operational amplifier, the temperature drift in a constructed embodiment of the invention has been held to less than .01 percent of full scale with temperature changes in the range of 25° C. to 65° C.

In accordance with the particular embodiment of the invention to be described, a compensating circuit is incorporated in the circuitry of the first stage of a two-stage direct-coupled transistor amplifier. This compensating network includes a transistor which is connected to develop a leakage current between two of its electrodes, and which has one of these electrodes connected to a common impedance with a corresponding electrode of the transistor in the first stage of the amplifier.

External resistors are included in the circuitry of the transistor in the first stage and in the circuit of the transistor in the compensating circuit, and these resistors serve to control the respective magnitudes of the leakage currents in each transistor. Then, as temperature increases, the leakage currents of both transistor increases. The control may be such that the increase of the leakage current in the compensating transistor is greater than the increase of the leakage current in the transistor of the first amplifier stage.

These leakage currents increase the voltage across the common impedance as the temperature increases, and this increased voltage tends to decrease the current flow through the transistor in the first amplifier stage so as to compensate for the increase in leakage current. The compensation may be adjusted so that the input current from the first transistor to the second transistor in the amplifier is independent of the transistor temperature changes.

Alternately, over-compensation can be used so that the input current to the second transistor actually decreases as the temperature increases. This decrease in input current to the second transistor can then be made to compensate for the increase of the leakage current of the second transistor for such temperature increase.

Figure 2:
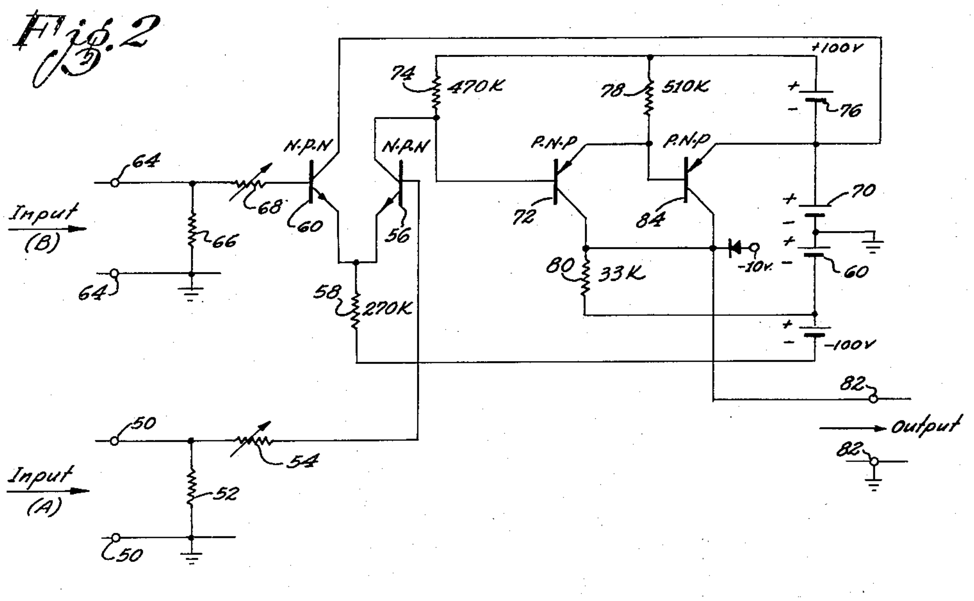

In the drawings:

FIGURE 1 is a circuit diagram of a prior art two-stage uncompensated direct-coupled transistor amplifier, the lack of compensation for leakage current changes with temperature in the transistors causing the amplifier to exhibit an undesirable temperature drift characteristic; and FIGURE 2 is a circuit diagram of a direct-coupled transistor amplifier constructed in accordance with one embodiment of the present invention and which includes means for compensating for the tendency of leakage currents in the individual transistors to vary as the temperature of the transistors changes.

The circuitry of FIGURE 1 includes a first transistor 10 which may, for example, be of the N-P-N conductivity type. The transistor 10 has a base connected to variable resistor 12, and it has an emitter connected to a resistor 14. The other terminal of the resistor 12 may be connected to one terminal of a resistor 16, the other terminal of the resistor being grounded. The resistor 16 serves as an appropriate means for introducing an input signal to the transistor 10, and it may be connected across a pair of input terminals 18 which are adapted to receive the input signal.

The collector of the transistor 10 is connected to the base of a transistor 20. This latter transistor may, for example, be of the P-N-P conductivity type. The emitter of the transistor 20 is connected to a resistor 22 which, in turn, is connected to the positive terminal of a direct voltage source 24. The base of the transistor 20, on the other hand, is connected to a resistor 26 which also is connected to that positive terminal.

The negative terminal of the source of direct voltage 24 is grounded, as is the positive terminal of a source of direct voltage 28. The collector of the transistor 20 is connected to a resistor 30 which, in turn, connects with the negative terminal of the source 28. The resistor 14 is also connected to the negative terminal of the source 28. A pair of output terminals 32 are connected respectively to the collector of the transistor 20 and to ground.

In the illustrated circuit of FIGURE 1, the source 28 biases the base and emitter of the transistor 10 in the appropriate direction to produce a current flow through the transistor 10. The transistor, in accordance with well known transistor principles, serves to produce an amplified current flow in its collector circuit. This collector current from the transistor 10 is introduced to the base of the transistor 20 by virtue of the direct-coupling connection; so that the base current of the transistor 20 is substantially the same as the collector current of the transistor 10.

However, the collector current of the transistor 10 is not only the amplified base current of that transistor, but it also contains a leakage current component which flows from the collector to the emitter of the transistor 10. This leakage current has been found to be a logarithmic function of the temperature of the transistor 10. Therefore, the base current of the transistor 20 will vary with temperature, as will the collector current of the latter transistor.

The base current of the transistor 20, therefore, will have a temperature sensitive characteristic due to the changes with temperature of the leakage current in the transistor 10. However, the collector current of the transistor 20 and, accordingly, the output signal from the amplifier, will exhibit temperature sensitive changes due not only to the leakage current in the transistor 10 but also due to the collector-emitter leakage current in the transistor 20.

The magnitude of the leakage current through the transistor 10 can be controlled by varying the resistor 12 in the external base circuit of the transistor 10. The leakage current through the transistor 10 increases as this external resistance increases, as noted, but it still remains a logarithmic function of temperature.

Therefore, when an input signal is introduced to the direct-coupled amplifier circuit of FIGURE 1, this signal is amplified by the amplifier. However, the output signal derived at the terminals 32 will be dependent on transistor temperature and will exhibit extraneous variations in amplitude due to the temperature changes of the transistors 10 and 20.

The circuitry of FIGURE 2 is an example of the concept of the present invention in which the leakage current in the transistor of the first amplifier stage is compensated to overcome the drift which is inherent in the circuitry of FIGURE 1.

The circuit of FIGURE 2 includes a first pair of input terminals 50 which are connected to the opposite sides of a grounded input impedance, such as a grounded resistor 52. The ungrounded terminal of the resistor 52 is connected to a variable resistor 54, and this variable resistor connects with the base of an N-P-N transistor 56. The emitter of the transistor 56 is connected to a common resistor 58, as is the emitter of an N-P-N compensating transistor 60. The resistor 58 is connected to the negative terminal of a direct voltage source 62, the positive terminal of this source being grounded.

The circuitry of FIGURE 2 may also include a second pair of input terminals 64 which are connected to the opposite sides of an input impedance, such as a grounded resistor 66. The ungrounded terminal of the resistor 66 is connected to a variable resistor 68 which, in turn, connects with the base of the transistor 60. The collector of the transistor 60 is connected to the positive terminal of a direct voltage source 70, the negative terminal of which is grounded. The collector of the transistor 56, on the other hand, is connected to the base of a transistor 72 and to a resistor 74. The resistor 74 connects with the positive terminal of a source of direct voltage 76, the negative terminal of which connects with the positive terminal of the source 70.

The emitter of the transistor 72 is connected to a resistor 78 which also connects with the positive terminal of the source 76. The collector of the transistor 72, on the other hand, is connected to a resistor 80, the other side of which is returned to the negative terminal of the direct voltage source 62. A first output terminal 82 is connected to the collector of the transistor 72, and the second output terminal 82 is grounded.

A transistor 84 has its collector connected to the collector of the transistor 72, has its base connected to the emitter of the transistor 72, and has its emitter connected to the positive terminal of the source 70. This latter transistor is included in a feedback circuit for the transistor 72.

Therefore, the transistors 56 and 72 are connected respectively in cascade, and as the first and second stages of a direct-coupled transistor amplifier. The transistor 60 is connected in a compensating circuit to compensate for changes in the leakage current in the transistor 56 as the temperature of the transistors vary. The transistor 84 provides feedback for the transistor 72.

In the circuit of FIGURE 2, the input signal introduced across the input terminals 50 is amplified by the transistor 56 and introduced to the base of the transistor 72 for further amplification. The resulting amplified current corresponding to the amplified signal flows through the resistor 80 to produce an amplified output signal across the output terminals 82.

However, and as described above, a leakage current also flows from the collector to the emitter in the transistor 56, and this leakage current tends to change in accordance with temperature changes of the transistor. Therefore, without compensation, the changes in the leakage current in the transistor 56 would produce spurious temperature-sensitive changes in the output signal across the terminals 82. However, the transistor 60 is connected in a compensating circuit so that a current flows from its base to its emitter, and the resulting amplified collector current through that transistor produces a collector to emitter leakage current through the transistor. This latter leakage current also changes in accordance with temperature changes of the transistor 60.

The emitter current in the transistor 60 and the emitter current in the transistor 56 both flow through the common resistor 58. This produces a voltage across the resistor 58, and this voltage is introduced to the emitter of the transistor 56. It follows that any increase in the leakage current in the transistor 60 or in the transistor 56 produces an increase of voltage across the resistor 58 which tends to reduce the current through the transistor 56. The leakage current through the transistor 60, therefore, has a compensating effect on the current flow through the transistor 56.

The adjustment of the resistor 68 and 54 may be such that the increase in leakage current through the transistor 60 due to temperature changes in that transistor is greater than the increase of leakage current through the transistor 56 due to temperature changes of the latter transistor. This adjustment may be such that the collector current of the transistor 56 and, therefore, the base current of the transistor 72 is made independent of the temperature of the transistors 56 and 60.

Moreover, by making the adjustment of the resistors 54 and 68 such that the transistor 56 is over-compensated, its collector current can be made to decrease with increasing temperature. This means that the base current of the transistor 72 is made to decrease with increasing temperature and thereby compensate for the increase in leakage current through that transistor.

It follows, therefore, that by the relative simple circuitry of FIGURE 2, and by the simple adjustment of a pair of variable resistors 54 and 68, the amplifier circuit of FIGURE 2 can be temperature stabilized within a high degree of accuracy.

As shown in FIGURE 2, a second input signal may be introduced across the input terminals 64 for translation through the transistor 60 to the emitter of the transistor 56. This latter input will be amplified by the amplifier of FIGURE 2, and it will appear in inverted form across the output terminals 82. The input signal introduced to the input terminals 50, on the other hand, will be amplified by the amplifier circuit without such phase inversion.

The transistor 84 is included in the circuit to provide a desired feedback control for the amplifier. In a practical constructed embodiment of the invention, the transistors 60, 56 and 72 were mounted in a common heat sink to eliminate temperature differences between the transistors. As pointed out previously, precise operational amplifiers have been constructed in accordance with the concepts of the invention illustrated in FIGURE 2. In such a constructed operational amplifier the following circuit constants were used:

| | |
|---|---|
| Resistor 54 | 0 (direct to ground). |
| Resistor 58 | 270K. |
| Variable resistor 68 | 5K. |
| Resistor 74 | 470K. |
| Resistor 78 | 510K. |
| Resistor 80 | 33K. |
| Transistor 56 | S 30 (Transitron). |
| Transistor 60 | S 30. |
| Transistor 72 | 2N495 (Philco). |
| Transistor 84 | GT 761 (General Transistor). |
| Voltage source 60 | —30 volts. |
| Voltage source 70 | +10 volts. |
| Voltage source 76 | +100 volts. |
| Also | —100 volts (see FIGURE 2). |

As also pointed out, when the circuitry of FIGURE 2 was employed in an operational amplifier, and when germanium transistors were utilized, the temperature drift was held to less than .1 percent of full scale with temperature changes of about 25° C. to 65° C.

The invention provides, therefore, an improved and relatively simple transistor amplifier which possesses all the inherent advantages to be gained from the use of transistors, and which includes extremely simple circuitry to temperature stabilize the amplifier circuit to overcome inherent instabilities in the transistors themselves.

I claim:

1. A direct-coupled transistor amplifier including: first and second transistors each having a first electrode, a second electrode and a third electrode; an input circuit connected to the first and second electrodes of the first transistor, an electrical connection extending from the third electrode of the first transistor to the first electrode of the second transistor, said electrical connection producing a leakage current between the second and third electrodes of the first transistor and the leakage current tending to vary with temperature changes of the first transistor, an output circuit connected to the second and third electrodes of the second transistor and producing a leakage current between the second and third electrodes thereof, the output circuit receiving from the second transistor a signal having a value dependent upon the leakage currents in the first and second transistors, circuit means including a third transistor having first, second and third electrodes and exhibiting a leakage current between the second and third electrodes thereof which varies in accordance with temperature changes of the third transistor, impedance means connected to the second electrode of the third transistor and to the second electrode of the first transistor for introducing a potential to the second electrode of the first transistor which varies in accordance with temperature changes of the third transistor, said potential serving to over-compensate the tendency of the leakage current in the first transistor to vary in accordance with temperature changes thereof and thereby compensate for changes in the leakage current of the second transistor in accordance with temperature changes of the second transistor.

2. A direct-coupled transistor amplifier including: first and second transistors each having a first electrode, a second electrode and a third electrode; an input circuit connected to the first and second electrodes of the first transistor, an electrical connection extending from the third electrode of the first transistor to the first electrode of the second transistor, said electrical connection producing a leakage current between the second and third electrodes of the first transistor and the leakage current tending to vary with temperature changes of the first transistor, an output circuit connected to the second and third electrodes of the second transistor and producing a leakage current between the second and third electrodes thereof, the output circuit receiving from the second transistor a signal having a value dependent upon the leakage currents in the first and second transistors, circuit means including a third transistor having first, second and third electrodes and exhibiting a leakage current between the second and third electrodes thereof which varies in accordance with temperature changes of the third transistor, an additional input circuit connected to the first and second electrodes of the third transistor, each of said input circuits including a variable impedance means serially connected to the first electrode of a corresponding one of the first and third transistors, impedance means connected to the second electrode of the third transistor and to the second electrode of the first transistor for introducing a potential to the second electrode of the first transistor which varies in accordance with temperature changes of the third transistor, said potential being adjustable in magnitude by a variation of said variable impedance means to overcompensate the tendency of the leakage current in the first transistor to vary in accordance with temperature changes thereof and thereby compensate for changes in the leakage current of the second transistor in accordance with temperature changes of the second transistor even when the first, second and third transistors are unmatched.

References Cited in the file of this patent

UNITED STATES PATENTS

| | | |
|---|---|---|
| 2,761,917 | Aronson | Sept. 4, 1956 |
| 2,789,164 | Stanley | Apr. 16, 1957 |
| 2,847,519 | Aronson | Aug. 12, 1958 |
| 2,848,564 | Keonjian | Aug. 19, 1958 |

OTHER REFERENCES

Slaughter article, "Feedback Stabilized Transistor Amplifier," by Dean Slaughter, Electronics, May 1955, pages 174 and 175 relied upon.

Shea: Principles of Transistor Circuits, John Wiley & Sons, copyright Sept. 15, 1953, page 175 relied upon.